US011769443B2

(12) United States Patent
Liu

(10) Patent No.: US 11,769,443 B2
(45) Date of Patent: Sep. 26, 2023

(54) PIXEL CIRCUIT AND DISPLAY PANEL COMPRISING WORKING STAGES

(71) Applicant: SHENZHEN CHINA STAR OPTOELECTRONICS SEMICONDUCTOR DISPLAY TECHNOLOGY CO., LTD., Shenzhen (CN)

(72) Inventor: Bin Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 172 days.

(21) Appl. No.: 17/436,180

(22) PCT Filed: Aug. 10, 2021

(86) PCT No.: PCT/CN2021/111667
§ 371 (c)(1),
(2) Date: Sep. 3, 2021

(87) PCT Pub. No.: WO2023/272884
PCT Pub. Date: Jan. 5, 2023

(65) Prior Publication Data

US 2023/0215341 A1 Jul. 6, 2023

(30) Foreign Application Priority Data

Jun. 28, 2021 (CN) ......................... 202110717800.5

(51) Int. Cl.
*G09G 3/3258* (2016.01)
*G09G 3/3233* (2016.01)
(Continued)

(52) U.S. Cl.
CPC ....... *G09G 3/32* (2013.01); *G09G 2300/0819* (2013.01); *G09G 2300/0842* (2013.01);
(Continued)

(58) Field of Classification Search
CPC ............. G09G 3/32; G09G 2300/0819; G09G 2300/0842; G09G 2300/0861;
(Continued)

(56) References Cited

U.S. PATENT DOCUMENTS

2017/0169761 A1 6/2017 Ma
2018/0190185 A1* 7/2018 Ko ....................... G09G 3/3233
(Continued)

FOREIGN PATENT DOCUMENTS

CN 103000126 A 3/2013
CN 106128360 A 11/2016
(Continued)

*Primary Examiner* — Kwang-Su Yang
(74) *Attorney, Agent, or Firm* — The Roy Gross Law Firm, LLC; Roy Gross

(57) ABSTRACT

A pixel circuit and a display panel are disclosed. The pixel circuit includes a first and a second power supply lines, a light-emitting element, a driving TFT, a storage capacitor, a writing TFT, a first, a second, and a third compensation TFTs. The storage capacitor is electrically connected to the driving TFT, the writing TFT is electrically connected to the driving TFT, the first compensation TFT is electrically connected to the driving TFT, the storage capacitor, and the driving TFT, the second compensation TFT is electrically connected to the storage capacitor and the first compensation TFT, the third compensation TFT is electrically connected to the storage capacitor, and the third compensation TFT is electrically connected to the light-emitting element.

6 Claims, 7 Drawing Sheets

100

(51) Int. Cl.
*G09G 3/3275* (2016.01)
*H01L 27/32* (2006.01)
*G09G 3/32* (2016.01)

(52) U.S. Cl.
CPC . *G09G 2300/0861* (2013.01); *G09G 2310/08* (2013.01); *G09G 2320/0233* (2013.01); *G09G 2320/045* (2013.01)

(58) Field of Classification Search
CPC ....... G09G 2310/08; G09G 2320/0233; G09G 2320/045
See application file for complete search history.

(56) References Cited

U.S. PATENT DOCUMENTS

| | | | | |
|---|---|---|---|---|
| 2020/0152130 | A1* | 5/2020 | Hong | H10K 59/123 |
| 2021/0097931 | A1 | 4/2021 | Yue et al. | |
| 2022/0319438 | A1* | 10/2022 | Sun | H10K 59/00 |
| 2022/0328570 | A1* | 10/2022 | Shang | H10K 59/123 |

FOREIGN PATENT DOCUMENTS

| | | | |
|---|---|---|---|
| CN | 107393478 | A | 11/2017 |
| CN | 108447445 | A | 8/2018 |
| CN | 110648630 | A | 1/2020 |
| CN | 111179854 | A | 5/2020 |
| CN | 111406280 | A | 7/2020 |
| CN | 111613180 | A | 9/2020 |
| CN | 112349241 | A | 2/2021 |

* cited by examiner

PIXEL CIRCUIT AND DISPLAY PANEL COMPRISING WORKING STAGES

CROSS REFERENCE TO RELATED APPLICATIONS

This application is a National Phase of PCT Patent Application No. PCT/CN2021/111667 having International filing date of Aug. 10, 2021, which claims the benefit of priority of Chinese Application No. 202110717800.5 filed Jun. 28, 2021. The contents of the above applications are all incorporated by reference as if fully set forth herein in their entirety.

FIELD OF INVENTION

The present application relates to the field of display technologies, and more particularly to a pixel circuit and a display panel.

BACKGROUND OF INVENTION

With the progress of the times, people's requirements for high-color gamut, high-contrast, and other displays are getting higher and higher. Mini LEDs/micro LEDs and organic light emitting diodes (OLEDs) have become more and more demanding in this regard. Good performance is gradually being favored by people. As LED light emission causes serious deterioration of a stress of thin film transistor (TFT) devices, especially driving TFTs, it will cause threshold voltage shift and infrared drop (IR-drop), resulting in brightness degradation. The brightness decay is generally the brightness decay of an LED lamp caused by a threshold voltage and the infrared drop (IR-drop).

SUMMARY OF INVENTION

Therefore, the technical problem to be solved by the present application is how to effectively compensate for attenuation of an LED current caused by a threshold voltage shift and an IR-drop.

A first aspect of the present application provides a pixel circuit comprising:

a first power supply line;

a second power supply line;

a light-emitting element and a driving transistor connected in series between the first power supply line and the second power supply line;

a storage capacitor, wherein a first end of the storage capacitor is electrically connected to a gate of the driving transistor;

a writing transistor, wherein one of a source and a drain of the writing transistor is electrically connected to one of a source and a drain of the driving transistor, and the other of the source and drain of the writing transistor is used to connect to a data signal;

a first compensation transistor, wherein one of a source and a drain of the first compensation transistor is electrically connected to the other of the source and the drain of the driving transistor, and the other of the source and the drain of the first compensation transistor is electrically connected to the first end of the storage capacitor and the gate of the driving transistor;

a second compensation transistor, wherein one of a source and a drain of the second compensation transistor is electrically connected to a second end of the storage capacitor, the other of the source and the drain of the second compensation transistor is used to connect to a reference voltage signal, and a gate of the second compensation transistor is electrically connected to a gate of the first compensation transistor; and a third compensation transistor, wherein one of a source and a drain of the third compensation transistor is electrically connected to the second end of the storage capacitor, and the other of the source and the drain of the third compensation transistor is electrically connected to the light-emitting element and the second power supply line.

In an optional embodiment of the present application, the pixel circuit further includes:

a first light emission control transistor, wherein one of a source and a drain of the first light emission control transistor is electrically connected to the other of the source and the drain of the driving transistor, and the other of the source and the drain of the first light emission control transistor is electrically connected to the first power supply line; and a second light emission control transistor, wherein one of a source and a drain of the second light emission control transistor is electrically connected to one of the source and drain of the driving transistor, and the other of the source and the drain of the second light emission control transistor is electrically connected to the light-emitting element.

In an optional embodiment of the present application, a gate of the first light emission control transistor is used to connect to a first light emission control signal, a gate of the second light-emission control transistor is used to connect to a second light emission control signal, a gate of the writing transistor is used to connect to a first control signal, the gate of the second compensation transistor and the gate of the first compensation transistor are used to connect to a second control signal, and a gate of the third compensation transistor is used to connect to a third control signal.

In an optional embodiment of the present application, working stages of the pixel circuit comprises:

an initialization phase; in the initialization phase, the driving transistor, the first light emission control transistor, the first compensation transistor, the second compensation transistor, and the writing transistor are in an on state, and the second light emission control transistor and the third compensation transistor are in an off state;

a threshold voltage detection and storage phase; in the threshold voltage detection and storage phase, the driving transistor, the first compensation transistor, the second compensation transistor, and the writing transistor are in an on state, and the first light emission control transistor, the second light emission control transistor, and the third compensation transistor are in an off state;

a VSS writing phase; in the VSS writing phase, the driving transistor, the writing transistor, and the third compensation transistor are in an on state, and the first compensation transistor, the second compensation transistor, and the first light emission control transistor and the second light emission control transistor are in an off state; and a light-emitting phase; in the light-emitting phase, the driving transistor, the first light emission control transistor, the second light emission control transistor, and the third compensation transistor are in an on state, and the writing transistor, the first compensation transistor, and the second compensation transistor are in an off state.

In an optional embodiment of the present application, in the initialization phase, the first control signal, the second control signal, and the first light emission control signal are set to a high potential; in the threshold voltage detection and storage phase, the first control signal and the second control signal is set to a high potential; in the VSS writing phase, the first control signal is set to a high potential, the second control signal changes from a high potential to a low potential, and the third control signal is set to a high potential; in the light-emitting phase, the first light emission control signal, the second light emission control signal, and the third control signal are all set to a high potential.

A second aspect of the present application provides a pixel circuit comprising:

a driving module;

a light-emitting module electrically connected to one of a source and a drain of the driving module;

a writing module, wherein an output end of the writing module is electrically connected to the other of the source and drain of the driving module, and an input end of the writing module is used to connect to a data signal;

a storage module, wherein a first end of the storage module is electrically connected to a gate of the driving module;

a first compensation module, wherein the first compensation module has a first output end and a second output end, the first output end is electrically connected to the first end of the storage module, and the second output end is electrically connected to a second end of the storage module; and a second compensation module, wherein an input end of the second compensation module is electrically connected to the light-emitting module, and an output end of the second compensation module is electrically connected to the second end of the storage module.

In an optional embodiment of the present application, a driving module comprises a driving transistor, the writing module comprises a writing transistor, the storage module comprises a storage capacitor; one of a source and a drain of the driving transistor is electrically connected to a source and a drain of the writing transistor, a gate of the driving transistor is electrically connected to a first end of the storage capacitor, the other of the source and the drain of the writing transistor is used to connected to a data signal, and a gate of the writing transistor is used to connected to a first control signal.

In an optional embodiment of the present application, the first compensation module comprises:

a first compensation transistor, wherein one of a source and a drain of the first compensation transistor is electrically connected to one of a source and a drain of the driving transistor, and the other of the source and the drain of the first compensation transistor is electrically connected to a gate of the driving transistor and a first end of the storage capacitor;

a second compensation transistor, wherein one of a source and a drain of the second compensation transistor is electrically connected to a second end of the storage capacitor, the other of the source and the drain of the second compensation transistor is used to connect to a reference voltage signal, and a gate of the second compensation transistor is electrically connected to a gate of the first compensation transistor and is used to connect to a second control signal.

In an optional embodiment of the present application, the second compensation module comprises a third compensation transistor, one of a source and a drain of the third compensation transistor is electrically connected to the light-emitting module, the other of the source and the drain of the third compensation transistor is electrically connected to the second end of the storage capacitor, and a gate of the third compensation transistor is used to connect to a third control signal.

In an optional embodiment of the present application, the pixel circuit further comprises:

a first light emission control transistor, wherein one of a source and a drain of the first light emission control transistor is electrically connected to the other of the source and drain of the driving transistor, and a gate of the first light emission control transistor is used to connect to a first light emission control signal; and a second light emission control transistor, wherein one of a source and a drain of the second light emission control transistor is electrically connected to the other of the source and drain of the driving transistor, one of the source and the drain of the second light emission control transistor is electrically connected to the light-emitting element, and a gate of the second light emission control transistor is used to connect to a second light emission control signal In an optional embodiment of the present application, working stages of the pixel circuit comprises:

an initialization phase; in the initialization phase, the driving transistor, the first light emission control transistor, the first compensation transistor, the second compensation transistor, and the writing transistor are in an on state, and the second light emission control transistor and the third compensation transistor are in an off state;

a threshold voltage detection and storage phase; in the threshold voltage detection and storage phase, the driving transistor, the first compensation transistor, the second compensation transistor, and the writing transistor are in an on state, and the first light emission control transistor, the second light emission control transistor, and the third compensation transistor are in an off state;

a VSS writing phase; in the VSS writing phase, the driving transistor, the writing transistor, and the third compensation transistor are in an on state, and the first compensation transistor, the second compensation transistor, and the first light emission control transistor and the second light emission control transistor are in an off state; and a light-emitting phase; in the light-emitting phase, the driving transistor, the first light emission control transistor, the second light emission control transistor, and the third compensation transistor are in an on state, and the writing transistor, the first compensation transistor, and the second compensation transistor are in an off state.

In an optional embodiment of the present application, in the initialization phase, the first control signal, the second control signal, and the first light emission control signal are set to a high potential; in the threshold voltage detection and storage phase, the first control signal and the second control signal is set to a high potential; in the VSS writing phase, the first control signal is set to a high potential, the second control signal changes from a high potential to a low potential, and the third control signal is set to a high potential; in the light-emitting phase, the first light emission control signal, the second light emission control signal, and the third control signal are all set to a high potential.

A third aspect of the present application provides a display panel including a substrate and the above-mentioned pixel circuit, and the pixel circuit is disposed on the substrate.

Beneficial effect: The pixel circuit and the display panel provided by the present application implement automatic threshold voltage and infrared voltage drop detection and compensation by designing a new 7T1C pixel circuit with specific timing to improve stability of a display panel.

DESCRIPTION OF DRAWINGS

In order to illustrate the technical solutions more clearly in the embodiments of the present application, the following will briefly introduce the drawings that need to be used in the description of the embodiments. Obviously, the drawings in the following description are only some embodiments of the present application. For those skilled in the art, without creative work, other drawings can be obtained from these drawings.

DETAILED DESCRIPTION OF PREFERRED EMBODIMENTS

Figure 1:
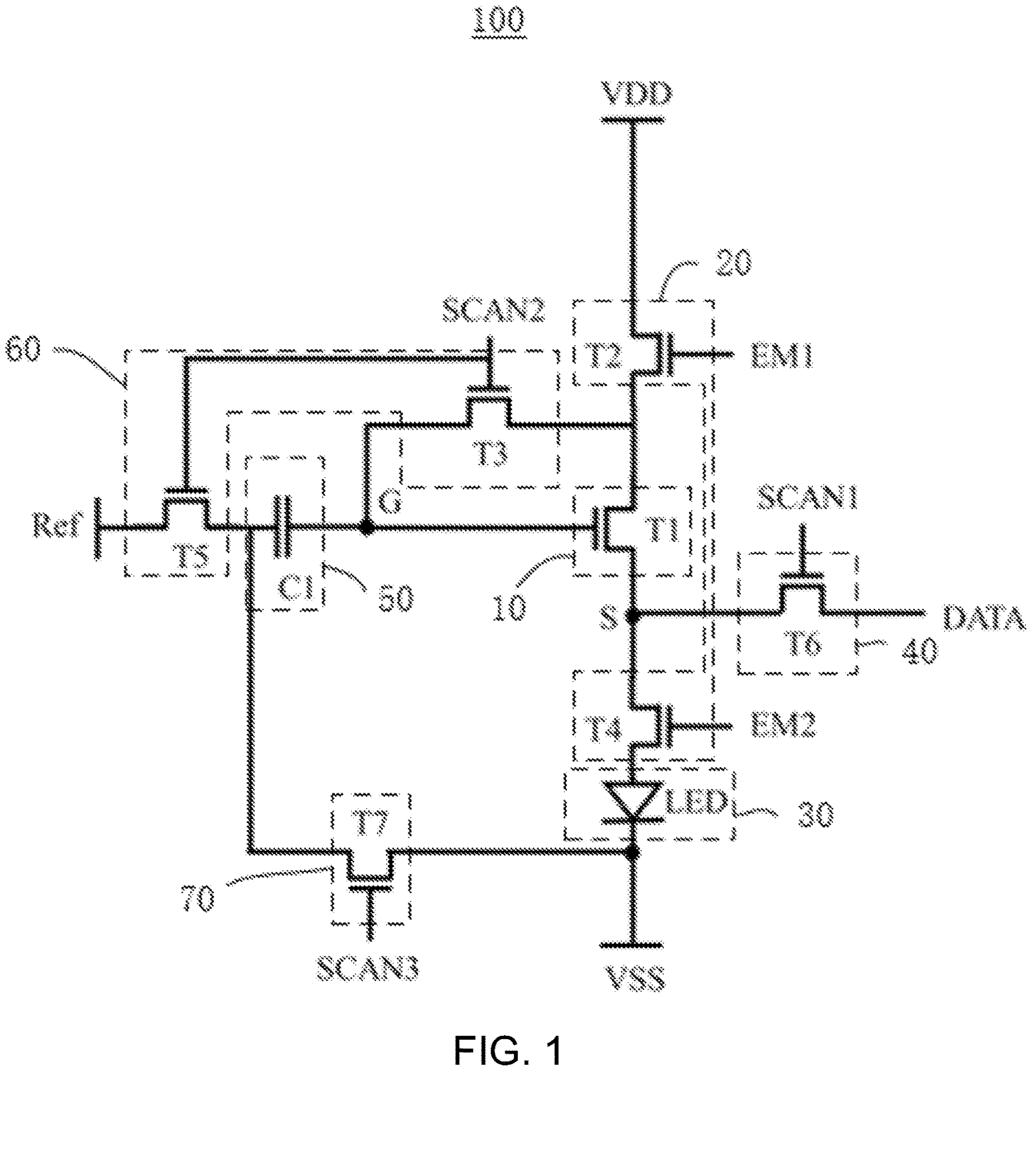
FIG. 1 is a schematic diagram of a structure of a pixel circuit provided by an embodiment of the present application.
Figure 2:
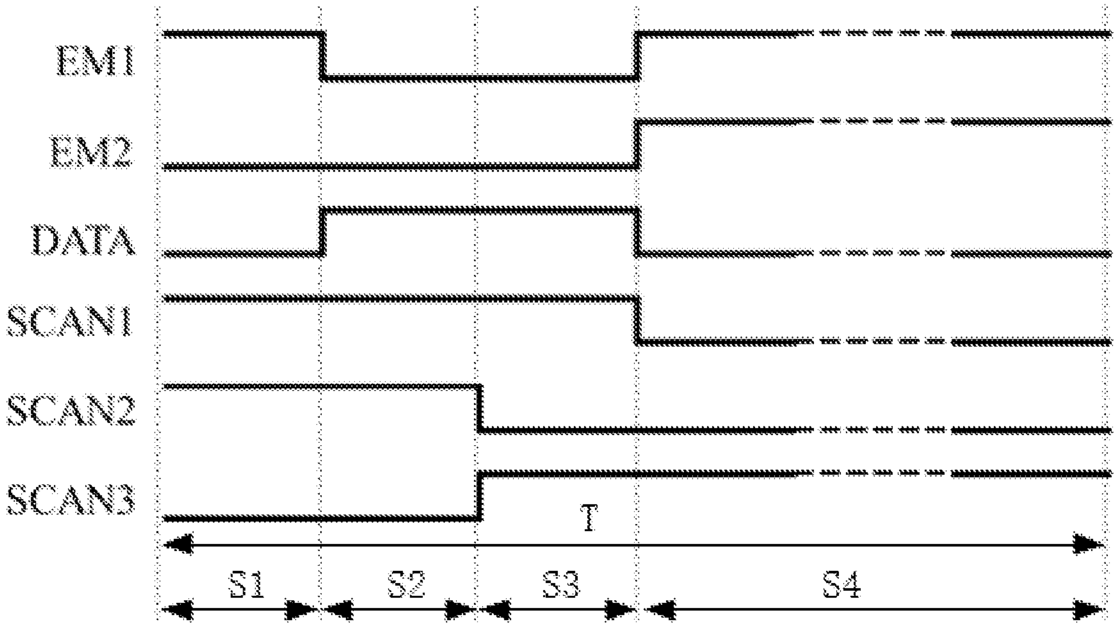
FIG. 2 is a timing diagram of the pixel circuit shown in FIG. 1.
Figure 3:
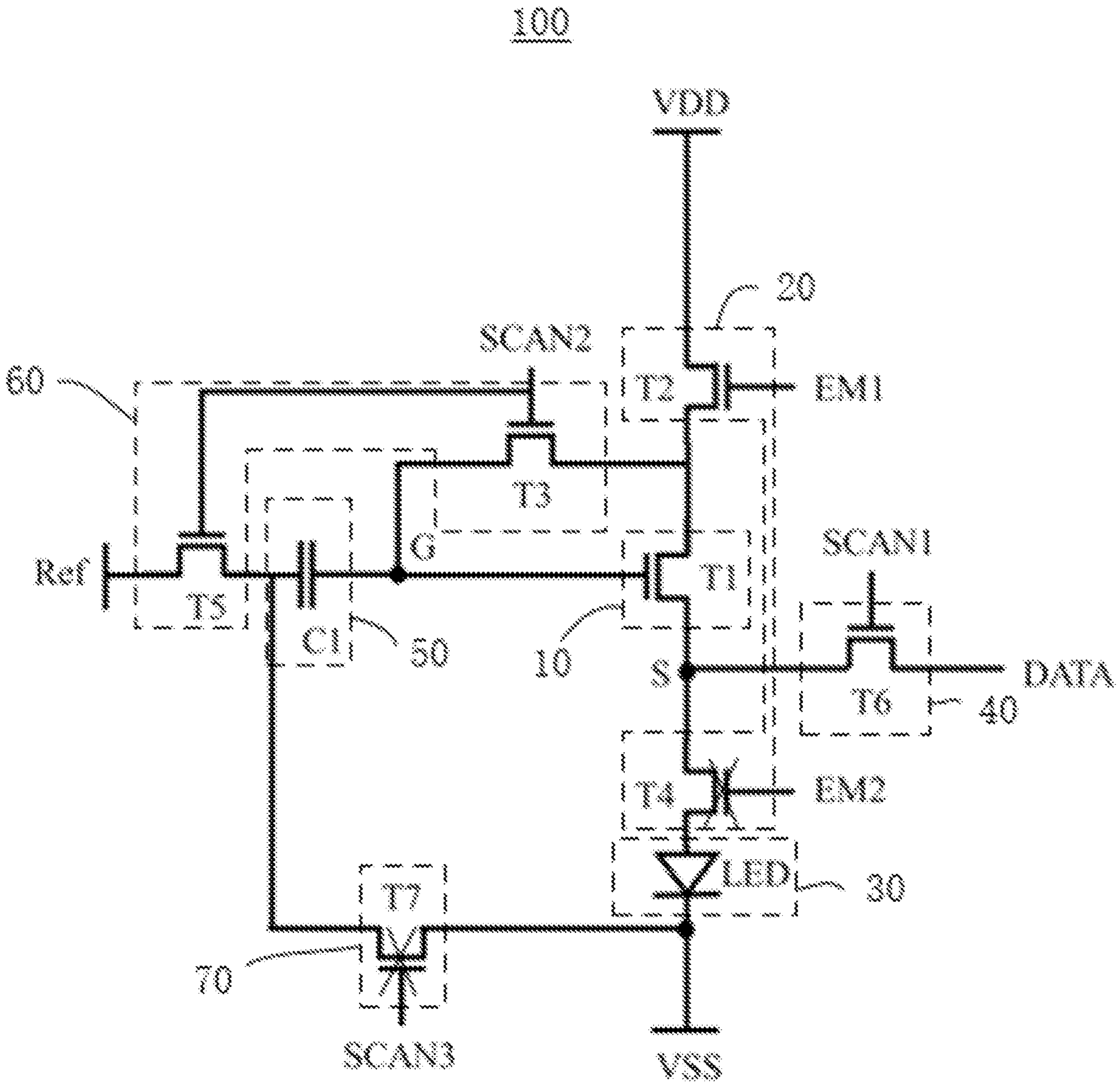
FIG. 3 is a working schematic diagram of an initialization phase of the pixel circuit in FIG. 1.
Figure 4:
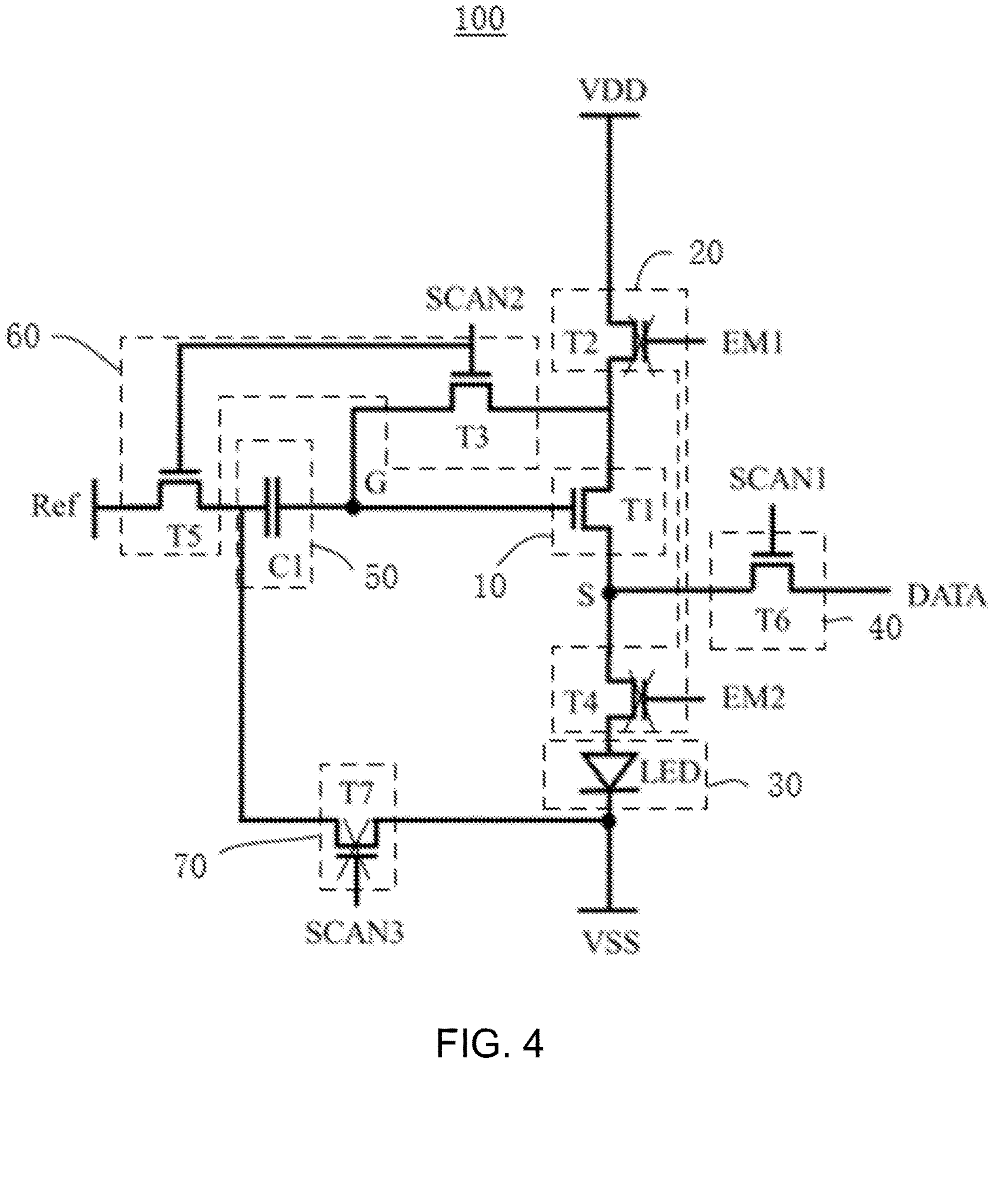
FIG. 4 is a schematic diagram of an operation of a threshold voltage detection and storage phase of the pixel circuit in FIG. 1.
Figure 5:
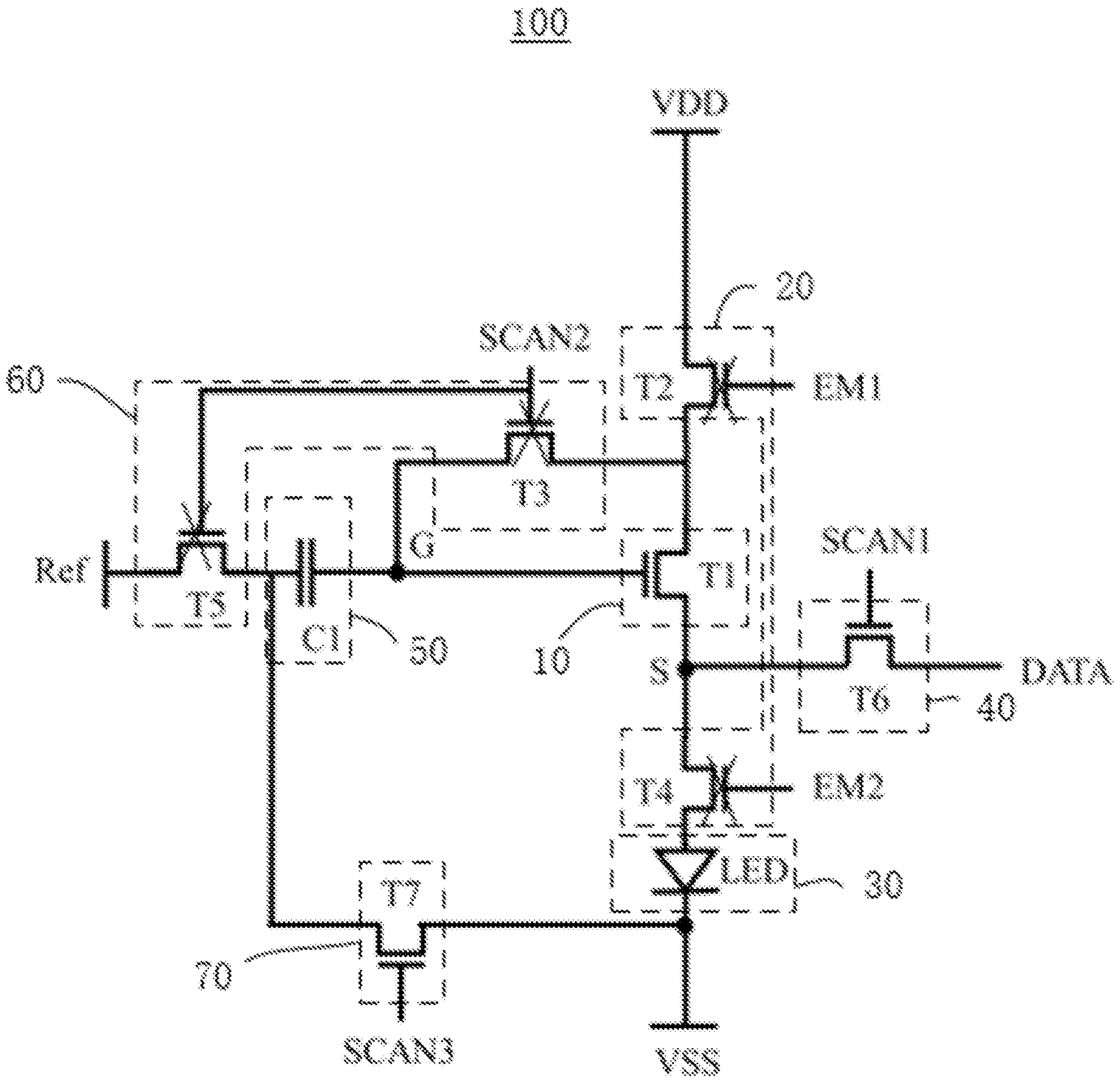
FIG. 5 is a working schematic diagram of a writing phase of the pixel circuit in FIG. 1.
Figure 6:
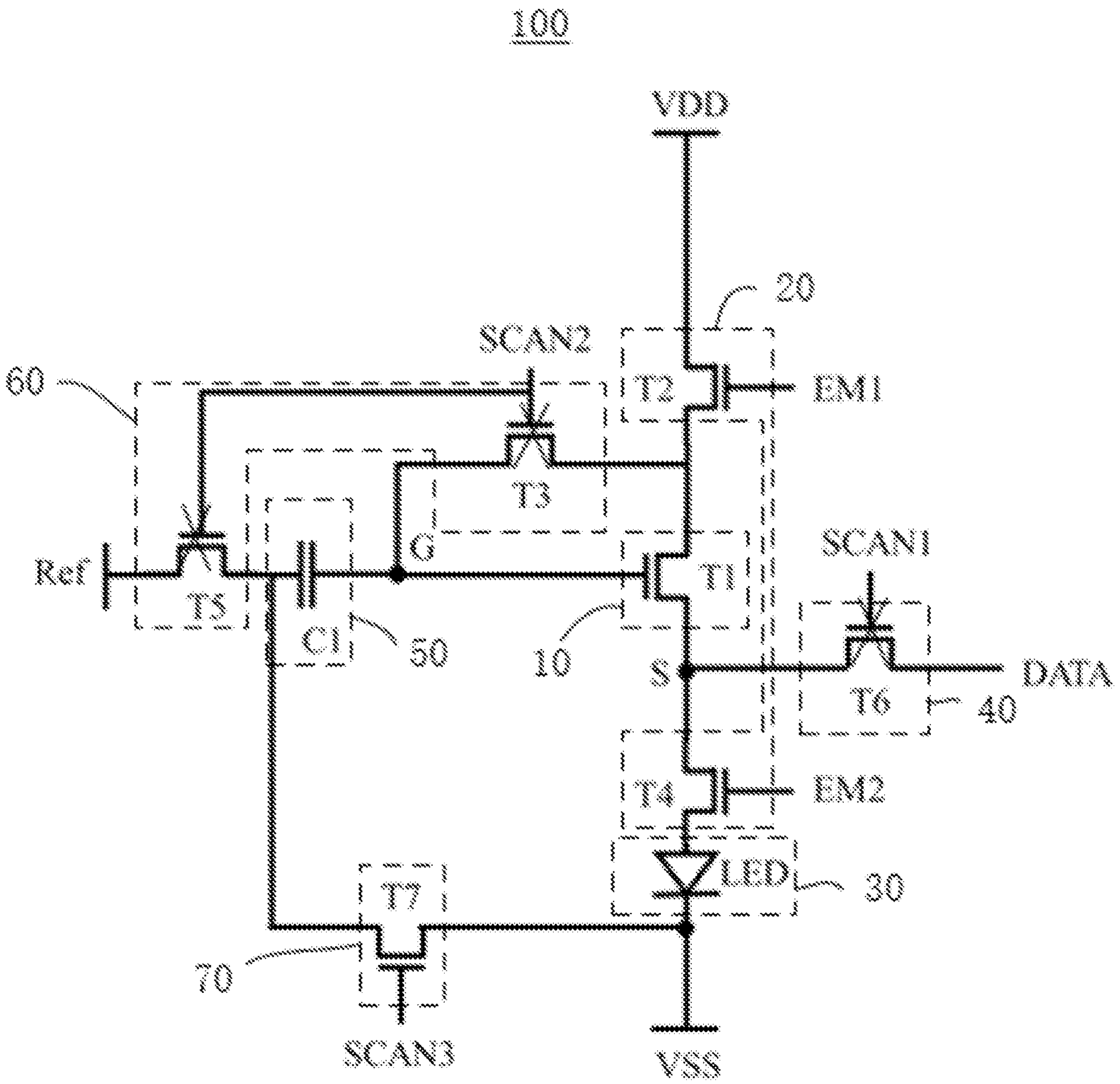
FIG. 6 is a working schematic diagram of a light-emitting stage of the pixel circuit in FIG. 1.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of the present application.

In the description of the present application, it should be understood that the orientation or positional relationship indicated by the terms “upper”, “lower”, etc. are based on the orientation or positional relationship shown in the drawings. This is only for the convenience of describing the present application and simplifying the description. This does not indicate or imply that the device or element referred to must have a specific orientation, be constructed, and be operated in a specific orientation, and therefore cannot be understood as a limitation of the present application. In addition, the terms “first” and “second” are only used for descriptive purposes and cannot be understood as indicating or implying relative importance or implicitly indicating the number of indicated technical features. Therefore, the features defined with “first” and “second” may explicitly or implicitly include one or more of the features. In the description of the present application, “multiple” means two or more than two, unless otherwise specifically defined.

The present application may repeat reference numbers and/or reference letters in different implementations. This repetition is for the purpose of simplification and clarity and does not in itself indicate the relationship between the various embodiments and/or settings discussed.

The present application addresses a serious deterioration of a stress of a TFT device caused by LED light emission of a current display panel, which will cause a threshold voltage shift and an infrared voltage drop, thereby causing the technical problem of brightness attenuation. By designing a new 7T1C pixel circuit with specific timing to realize automatic threshold voltage and infrared voltage drop detection and compensation, so as to improve stability of a display panel.

A pixel circuit and a display panel of the present application will be described in detail below in conjunction with specific embodiments.

Referring to FIG. 1 to FIG. 6, a preferred embodiment of the present application provides a pixel circuit 100. The pixel circuit 100 includes a driving module 10, a light-emitting module 30, a writing module 40, a storage module 50, a first compensation module 60, and a second compensation module 70. The driving module 10 is used to generate a driving current to drive a deflection of liquid crystal. An anode of the light-emitting module 30 is electrically connected to an output end of the driving module 10 for emitting light in a light-emitting phase of the pixel circuit 100. One end of the writing module 40 is electrically connected to the output end of the driving module 10, and the other end of the writing module 40 is connected to a data line for connecting a data signal DATA. A first end of the storage module 50 is electrically connected to a control end of the driving module 10 for storing the data signal DATA and a compensation signal in a time-sharing manner in the same frame, so as to maintain a control end potential of the driving module 10 during the light-emitting phase. The first compensation module 60 is electrically connected to a first end and a second end of the storage module 50, respectively, to output a first compensation signal in the initialization phase and the threshold voltage detection and storage phase. An input end of the second compensation module 70 is electrically connected to a cathode of the light-emitting module 30, and an output end of the second compensation module 70 is electrically connected to a second end of the storage module 50, so as to output a second compensation signal during the writing phase.

In an optional embodiment of the present application, the driving module 10 includes a driving transistor T1. One of a source and a drain of the driving transistor T1 is electrically connected to an output end of the writing module 40. The other of the source and the drain of the driving transistor T1 is electrically connected to a first power signal VDD. A gate of the driving transistor T1 is electrically connected to the first end of the storage module 50.

In an optional embodiment of the present application, the pixel circuit 100 further includes a light emission control module 20 (as shown in FIG. 1, FIG. 3, FIG. 4, FIG. 5, and FIG. 6), which is electrically connected to the driving module 10, and is configured to control the a light-emitting loop of the pixel circuit 100 according to on-off of a light emission control signal.

Specifically, the light emission control module 20 includes a first light emission control transistor T2 and a second light emission control transistor T4.

One of a source and a drain of the first light emission control transistor T2 is electrically connected to one of the source and the drain of the driving transistor T1. The other of the source and the drain of the first light emission control transistor T2 is electrically connected to the first power signal VDD. A gate of the first emission control transistor T2 is used to connect to a first emission control signal EM1.

One of a source and a drain of the second light emission control transistor T4 is connected to the other of the source and the drain of the driving transistor T1. The other of the source and the drain of the second light emission control transistor T4 is electrically connected to the anode of the light-emitting module 30. A gate of the second emission control transistor T4 is used to connect to a second emission control signal EM2.

In an optional embodiment of the present application, the light-emitting module 30 includes a light-emitting element. A cathode of the light-emitting element is electrically connected to a second power signal VSS. An anode of the light-emitting element is electrically connected to the other of the source and the drain of the second light emission control transistor T4.

A potential of the first power signal VDD is higher than a potential of the second power signal VSS. The light-emitting element can be, but is not limited to, a light-emitting diode such as an organic light-emitting diode (OLED), Mini-LED and a micro-LED.

In an optional embodiment of the present application, the writing module 40 includes a writing transistor T6. One of a source and a drain of the writing transistor T6 is used to connect to the data signal DATA. The other of the source and the drain of the writing transistor T6, the other of the source or the drain of the driving transistor T1, and one of the source and the drain of the second light emission control transistor T4 are electrically connected. A gate of the writing transistor T6 is used to connect to a first control signal SCAN1.

In an optional embodiment of the present application, the other of the source and the drain of the writing transistor T6, the other of the source or the drain of the driving transistor T1, and one of the source and the drain of the second light emission control transistor T4 are electrically connected at a point S.

In an optional embodiment of the present application, the storage module 50 includes a storage capacitor C1. A first end of the storage capacitor C1 is electrically connected to the gate of the driving transistor T1. A second end of the storage capacitor C1 is electrically connected to the output end of the second compensation module 70.

In an optional embodiment of the present application, the first compensation module 60 includes a first compensation transistor T3 and a second compensation transistor T5. One of a source and a drain of the first compensation transistor T3, one of the source and the drain of the driving transistor T1, and one of the source and the drain of the first light emission control transistor T2 are electrically connected. The other of the source and the drain of the first compensation transistor T3, the gate of the driving transistor T1, and the first end of the storage capacitor C1 are electrically connected. The gate of the first compensation transistor T3 is connected to a second control signal SCAN2. One of the source and the drain of the second compensation transistor T5 is electrically connected to the second end of the storage capacitor C1. The other of the source and the drain of the second compensation transistor T5 is connected to a reference voltage signal Ref. A gate of the second compensation transistor T5 is electrically connected to the gate of the first compensation transistor T3 and is connected to a second control signal SCAN2.

In an optional embodiment of the present application, the other of the source and the drain of the first compensation transistor T3, the gate of the driving transistor T1, and the first end of the storage capacitor C1 are electrically connected at a point G.

In an optional embodiment of the present application, the second compensation module 70 includes a third compensation transistor T7. One of the source and the drain of the third compensation transistor T7 is electrically connected to the cathode of the light-emitting element. The other of the source and the drain of the third compensation transistor T7 is electrically connected to the second end of the storage capacitor C1. A gate of the third compensation transistor T7 is connected to a third control signal SCAN3.

In an optional embodiment of the present application, the point at which the other of the source and the drain of the third compensation transistor T7 is electrically connected to the second end of the storage capacitor C1 is located between the second compensation transistor T5 and the second end of the storage capacitor C1.

In the same frame, an effective pulse of the first control signal is in an initialization phase, a threshold voltage detection storage phase, and a VSS writing phase. An effective pulse of the second control signal is in the initialization phase and the threshold voltage detection and storage phase. An effective pulse of the third control signal is in the VSS writing phase and a light-emitting phase.

In an optional embodiment of the present application, the transistor in the above-mentioned embodiment may be, but not limited to, a P-channel type thin film transistor, and may also be an N-channel type thin film transistor.

In an optional embodiment of the present application, the transistor in the foregoing embodiment may be, but is not limited to, a polysilicon thin film transistor, and specifically may also be a low temperature polysilicon thin film transistor.

As shown in FIG. 2 to FIG. 6, in one of the embodiments, the working phase of the above-mentioned pixel circuit within one frame time T may include:

A first stage S1 is the initialization stage: the first control signal SCAN1, the second control signal SCAN2, and the first light emission control signal EM1 are set to a high potential. The first light emission control transistor T2, the first compensation transistor T3, the second compensation transistor T5, and the writing transistor T6 are in an on state. The DATA writing voltage is DATA_L, the potential of the initialization point G is VDD, and the potential of the initialization point S is DATA_L. At this time, the third control signal SCAN3 and the second light emission control signal EM2 are set to a low potential. The second light emission control transistor T4 and the third compensation transistor T7 are both in an off state. The cross X in FIG. 3 can indicate that the corresponding thin film transistor is in the off state.

A second stage S2 is the threshold voltage detection and storage stage: the first control signal SCAN1 and the second control signal SCAN2 are set to a high potential. The first compensation transistor T3, the second compensation transistor T5, and the writing transistor T6 are in an on state. The DATA write voltage becomes DATA_H, that is, the potential at point S is DATA_H, and the potential at point G changes from VDD to $DATA\_H+V_{th}$. At this time, the third control signal SCAN3, the first light emission control signal EM1, and the second light emission control signal EM2 are set to a low potential. The first light emission control transistor T2, the second light emission control transistor T4, and the third compensation transistor T7 are all in an off state. The cross X in FIG. 4 can indicate that the corresponding thin film transistor is in the off state. At this time, the potential difference between the first end and the second end of the storage capacitor C1 is $V_1-V_2=V_G-V_{ref}=DATA\_H+V_{th}-V_{ref}$.

A third stage S3 is the VSS writing stage: the first control signal SCAN1 is set to a high potential. The second control signal SCAN2 changes from a high potential to a low potential. The third control signal SCAN3 is set to a high potential. The first light emission control signal EM1 and the second light emission control signal EM2 are set to a low potential. At this time, the writing transistor T6 and the third compensation transistor T7 are in an on state. The first light emission control transistor T2, the first compensation transistor T3, the second light emission control transistor T4, and the second compensation transistor T5 are all in an off state. The cross X in FIG. 5 can indicate that the corresponding thin film transistor is in the off state. At this time, the potential difference between the first end and the second end of the storage capacitor C1 is $V_1-V_2=V'_G-VSS=DATA\_H+V_{th}-V_{ref}$, then $V'_G=DATA\_H+V_{th}+VSS-V_{ref}$, and the potential of the point S is DATA_H.

A fourth stage S4 is the light-emitting stage: the first light emission control signal EM1, the second light emission control signal EM2, and the third control signal SCAN3 are all set to a high potential. At this time, the first light emission control transistor T2, the second light emission control transistor T4, and the third compensation transistor T7 are in an on state, and the light-emitting element emits light. The first control signal SCAN1 and the second control signal SCAN2 are both set to a low potential. The first compensation transistor T3, the second compensation transistor T5, and the write transistor T6 are in an off state. The cross X in FIG. 6 can indicate that the corresponding thin film transistor is in the off state. At this time, S point potential $V_s=V\_LED+VSS$, G point potential $V'_G=DATA\_H+V_{th}+VSS-V_{ref}$, then $V_{gs}=V'_G-V_s=DATA\_H+V_{th}+VSS-V_{ref}-(V\_LED+VSS)=DATA\_H+V_{th}-Vref-V\_LED$, then $Vgs-V_{th}=DATA\_H-V_{ref}-V\_LED$, therefore, $V_{gs}-V_{th}$ has nothing to do with the threshold voltage and the VSS voltage.

According to $I=k(V_{gs}-V_{th})^2$, I is a driving current, and k is an intrinsic conductivity factor. It can be obtained that I is related to $V_{gs}-V_{th}$. Combining $V_{gs}-V_{th}$ has nothing to do with the threshold voltage and VSS voltage, it can be obtained that: I has nothing to do with the threshold voltage and the VSS voltage. Therefore, the pixel circuit 100 of the present application can realize the compensation of Vth and infrared drop (IR-drop).

Based on the above analysis, the pixel circuit 100 provided by the present application includes a first power supply line, a second power supply line, a light-emitting element, a storage capacitor C1, a driving transistor T1, a first light emission control transistor T2, a second light emission control transistor T4, a writing transistor T6, a first compensation transistor T3, a second compensation transistor T5, and a third compensation transistor T7. The light-emitting element, the driving transistor T1, the first light emission control transistor T2, and the second light emission control transistor T4 are connected in series between the first power supply line and the second power supply line. Specifically, the driving transistor T1 is connected in series with the first light emission control transistor T2 and the second light emission control transistor T4. The first light emission control transistor T2 is connected in series between the first power supply line and the driving transistor T1. The second light emission control transistor T4 is connected in series between the light-emitting element and the driving transistor T1. The light-emitting element is connected in series between the second light emission control transistor T4 and the second power supply line. The first end of the storage capacitor C1 is electrically connected to the gate of the driving transistor T1. One of the source and the drain of the writing transistor T6 is used to transmit a data signal. The other of the source and the drain of the writing transistor T6 is connected to the point S between the driving transistor T1 and the second light emission control transistor T4. The gate of the writing transistor T6 is used to connect to the first control signal SCAN1. One of the source and the drain of the first compensation transistor T3 is connected between the driving transistor T1 and the first light emission control transistor T2. The other of the source and the drain of the first compensation transistor T3 is connected to the point G between the gate of the driving transistor T1 and the first end of the storage capacitor C1. One of the source and the drain of the second compensation transistor T5 is connected to the second end of the storage capacitor C1. The other of the source and drain of the second compensation transistor T5 is used to transmit a reference voltage signal. The gate of the second compensation transistor T5 is electrically connected to the gate of the first compensation transistor T3. The gate of the second compensation transistor T5 and the first compensation transistor T3 both input the second control signal SCAN2. One of the source and the drain of the third compensation transistor T7 is connected to the light-emitting element and the second power supply line. The other of the source and the drain of the third compensation transistor T7 is connected to the second end of the storage capacitor C1. The gate of the third compensation transistor T7 is used to connect to the third control signal SCAN3.

Figure 7:
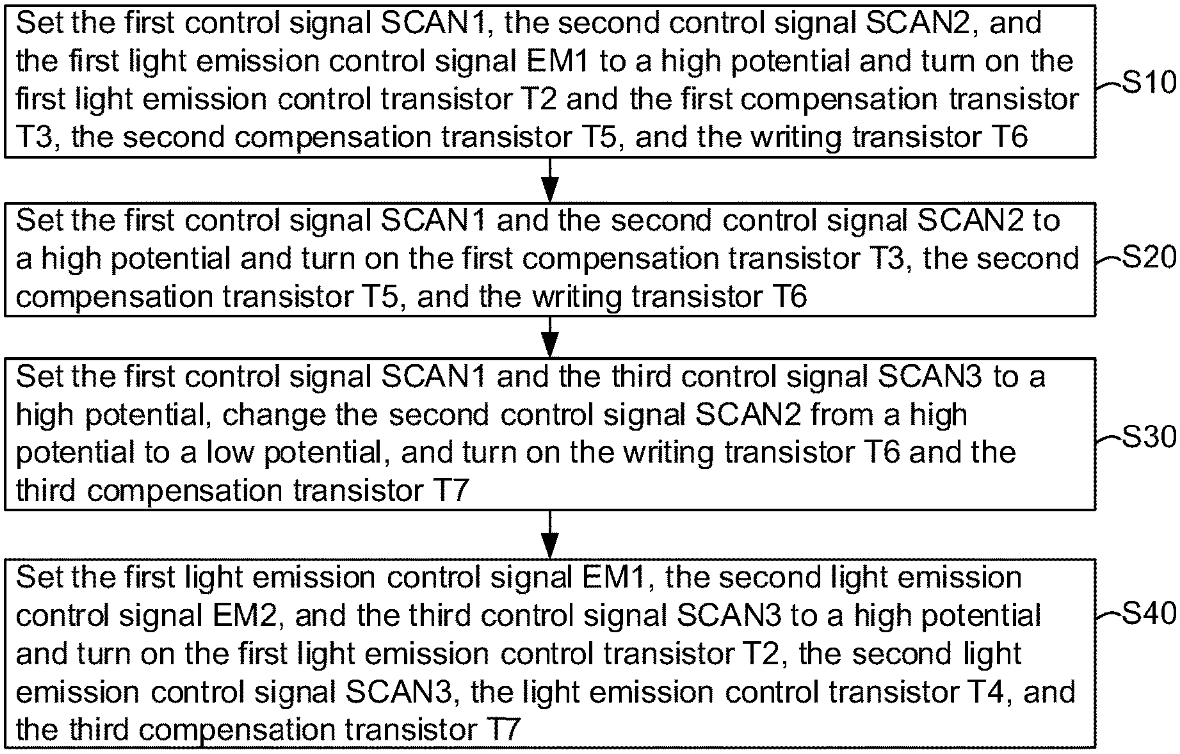
FIG. 7 is a flowchart of a method for removing a pixel circuit according to an embodiment of the present application.

Referring to FIG. 7, the present application also provides a driving method of the pixel circuit 100, which includes the steps:

Step S10: Set the first control signal SCAN1, the second control signal SCAN2, and the first light emission control signal EM1 to a high potential and turn on the first light emission control transistor T2 and the first compensation transistor T3, the second compensation transistor T5, and the writing transistor T6.

Step S20: Set the first control signal SCAN1 and the second control signal SCAN2 to a high potential and turn on the first compensation transistor T3, the second compensation transistor T5, and the writing transistor T6.

Step S30: Set the first control signal SCAN1 and the third control signal SCAN3 to a high potential, change the second control signal SCAN2 from a high potential to a low potential, and turn on the writing transistor T6 and the third compensation transistor T7.

Step S40: Set the first light emission control signal EM1, the second light emission control signal EM2, and the third control signal SCAN3 to a high potential and turn on the first light emission control transistor T2, the second light emission control signal SCAN3, the light emission control transistor T4, and the third compensation transistor T7.

It is understandable that the driving method of the pixel circuit 100 provided in this embodiment can realize automatic detection and compensation of the threshold voltage and infrared voltage drop through the 7T1C pixel circuit of the present application with a specific timing sequence, so as to improve stability of a display panel.

The present application provides a display panel, which includes a substrate (not shown) and the pixel circuit 100 in any of the above-mentioned embodiments. The pixel circuit 100 is disposed on the substrate.

It is understandable that the display panel provided in this embodiment can realize automatic threshold voltage and infrared voltage drop detection and compensation through the 7T1C pixel circuit of the present application with specific timing, so as to improve the stability of the display panel.

In the foregoing embodiments, the description of each embodiment has its own focus. For parts that are not described in detail in a certain embodiment, reference may be made to related descriptions of other embodiments.

The pixel circuit and the display panel provided by the embodiments of the present application have been described in detail above. Specific examples are used in this article to illustrate the principle and implementation of the present application. The descriptions of the above embodiments are only used to help understand the technical solutions and core ideas of the present application. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. A pixel circuit, comprising:

a first power supply line;

a second power supply line;

a light-emitting element and a driving transistor connected in series between the first power supply line and the second power supply line;

a storage capacitor, wherein a first end of the storage capacitor is electrically connected to a gate of the driving transistor;

a writing transistor, wherein one of a source and a drain of the writing transistor is electrically connected to one of a source and a drain of the driving transistor, and the other of the source and the drain of the writing transistor is used to connect to a data signal;

a first compensation transistor, wherein one of a source and a drain of the first compensation transistor is electrically connected to the other of the source and the drain of the driving transistor, and the other of the source and the drain of the first compensation transistor is electrically connected to the first end of the storage capacitor and the gate of the driving transistor;

a second compensation transistor, wherein one of a source and a drain of the second compensation transistor is electrically connected to a second end of the storage capacitor, the other of the source and the drain of the second compensation transistor is used to connect to a reference voltage signal, and a gate of the second compensation transistor is electrically connected to a gate of the first compensation transistor; and a third compensation transistor, wherein one of a source and a drain of the third compensation transistor is electrically connected to the second end of the storage capacitor, and the other of the source and the drain of the third compensation transistor is electrically connected to the light-emitting element and the second power supply line, wherein the pixel circuit further comprises:

a first light emission control transistor, wherein one of a source and a drain of the first light emission control transistor is electrically connected to the other of the source and the drain of the driving transistor, and the other of the source and the drain of the first light emission control transistor is electrically connected to the first power supply line; and a second light emission control transistor, wherein one of a source and a drain of the second light emission control transistor is electrically connected to one of the source and drain of the driving transistor, and the other of the source and the drain of the second light emission control transistor is electrically connected to the light-emitting element, wherein a gate of the first light emission control transistor is used to connect to a first light emission control signal, a gate of the second light-emission control transistor is used to connect to a second light emission control signal, a gate of the writing transistor is used to connect to a first control signal, the gate of the second compensation transistor and the gate of the first compensation transistor are used to connect to a second control signal, and a gate of the third compensation transistor is used to connect to a third control signal, wherein working stages of the pixel circuit comprises:

an initialization phase; in the initialization phase, the driving transistor, the first light emission control transistor, the first compensation transistor, the second compensation transistor, and the writing transistor are in an on state, and the second light emission control transistor and the third compensation transistor are in an off state;

a threshold voltage detection and storage phase; in the threshold voltage detection and storage phase, the driving transistor, the first compensation transistor, the second compensation transistor, and the writing transistor are in an on state, and the first light emission control transistor, the second light emission control transistor, and the third compensation transistor are in an off state;

a second power signal (VSS) writing phase; in the VSS writing phase, the driving transistor, the writing transistor, and the third compensation transistor are in an on state, and the first compensation transistor, the second compensation transistor, and the first light emission control transistor and the second light emission control transistor are in an off state; and a light-emitting phase; in the light-emitting phase, the driving transistor, the first light emission control transistor, the second light emission control transistor, and the third compensation transistor are in an on state, and the writing transistor, the first compensation transistor, and the second compensation transistor are in an off state.

2. The pixel circuit according to claim 1, wherein: in the initialization phase, the first control signal, the second control signal, and the first light emission control signal are set to a high potential; in the threshold voltage detection and storage phase, the first control signal and the second control signal is set to a high potential; in the VSS writing phase, the first control signal is set to a high potential, the second control signal changes from a high potential to a low potential, and the third control signal is set to a high potential; and in the light-emitting phase, the first light emission control signal, the second light emission control signal, and the third control signal are all set to a high potential.

3. A pixel circuit, comprising:

a driving module;

a light-emitting module electrically connected to an output end of the driving module;

a writing module, wherein an output end of the writing module is electrically connected to the output end of the driving module, and an input end of the writing module is used to connect to a data signal;

a storage module, wherein a first end of the storage module is electrically connected to a gate of the driving module;

a first compensation module, wherein the first compensation module has a first output end and a second output end, the first output end is electrically connected to the first end of the storage module, and the second output end is electrically connected to a second end of the storage module; and a second compensation module, wherein an input end of the second compensation module is electrically connected to the light-emitting module, and an output end of the second compensation module is electrically connected to the second end of the storage module;

wherein: a driving module comprises a driving transistor, the writing module comprises a writing transistor, the storage module comprises a storage capacitor; and one of a source and a drain of the driving transistor is electrically connected to one of a source and a drain of the writing transistor, a gate of the driving transistor is electrically connected to a first end of the storage capacitor, the other of the source and the drain of the writing transistor is used to connected to a data signal, and a gate of the writing transistor is used to connected to a first control signal, wherein the first compensation module comprises:

a first compensation transistor, wherein one of a source and a drain of the first compensation transistor is electrically connected to one of a source and a drain of the driving transistor, and the other of the source and the drain of the first compensation transistor is electrically connected to a gate of the driving transistor and the first end of the storage capacitor, and a second compensation transistor, wherein one of a source and a drain of the second compensation transistor is electrically connected to a second end of the storage capacitor, the other of the source and the drain of the second compensation transistor is used to connect to a reference voltage signal, and a gate of the second compensation transistor is electrically connected to a gate of the first compensation transistor and is used to connect to a second control signal, wherein the second compensation module comprises a third compensation transistor, one of a source and a drain of the third compensation transistor is electrically connected to the light-emitting module, the other of the source and the drain of the third compensation transistor is electrically connected to the second end of the storage capacitor, and a gate of the third compensation transistor is used to connect to a third control signal, wherein the pixel circuit further comprises:

a first light emission control transistor, wherein one of a source and a drain of the first light emission control transistor is electrically connected to the other of the source and drain of the driving transistor, and a gate of the first light emission control transistor is used to connect to a first light emission control signal; and a second light emission control transistor, wherein one of a source and a drain of the second light emission control transistor is electrically connected to the other of the source and drain of the driving transistor, one of the source and the drain of the second light emission control transistor is electrically connected to the light-emitting element, and a gate of the second light emission control transistor is used to connect to a second light emission control signal, and wherein working stages of the pixel circuit comprises:

an initialization phase; in the initialization phase, the driving transistor, the first light emission control transistor, the first compensation transistor, the second compensation transistor, and the writing transistor are in an on state, and the second light emission control transistor and the third compensation transistor are in an off state;

a threshold voltage detection and storage phase; in the threshold voltage detection and storage phase, the driving transistor, the first compensation transistor, the second compensation transistor, and the writing transistor are in an on state, and the first light emission control transistor, the second light emission control transistor, and the third compensation transistor are in an off state;

a second power signal (VSS) writing phase; in the VSS writing phase, the driving transistor, the writing transistor, and the third compensation transistor are in an on state, and the first compensation transistor, the second compensation transistor, and the first light emission control transistor and the second light emission control transistor are in an off state; and a light-emitting phase; in the light-emitting phase, the driving transistor, the first light emission control transistor, the second light emission control transistor, and the third compensation transistor are in an on state, and the writing transistor, the first compensation transistor, and the second compensation transistor are in an off state.

4. The pixel circuit according to claim 3, wherein in the initialization phase, the first control signal, the second control signal, and the first light emission control signal are set to a high potential; in the threshold voltage detection and storage phase, the first control signal and the second control signal is set to a high potential; in the VSS writing phase, the first control signal is set to a high potential, the second control signal changes from a high potential to a low potential, and the third control signal is set to a high potential; in the light-emitting phase, the first light emission control signal, the second light emission control signal, and the third control signal are all set to a high potential.

5. A display panel comprising a substrate and a pixel circuit, wherein the pixel circuit is disposed on the substrate;

wherein the pixel circuit comprises:

a first power supply line;

a second power supply line;

a light-emitting element and a driving transistor connected in series between the first power supply line and the second power supply line;

a storage capacitor, wherein a first end of the storage capacitor is electrically connected to a gate of the driving transistor;

a writing transistor, wherein one of a source and a drain of the writing transistor is electrically connected to one of a source and a drain of the driving transistor, and the other of the source and the drain of the writing transistor is used to connect to a data signal;

a first compensation transistor, wherein one of a source and a drain of the first compensation transistor is electrically connected to the other of the source and the drain of the driving transistor, and the other of the source and the drain of the first compensation transistor is electrically connected to the first end of the storage capacitor and the gate of the driving transistor;

a second compensation transistor, wherein one of a source and a drain of the second compensation transistor is electrically connected to a second end of the storage capacitor, the other of the source and the drain of the second compensation transistor is used to connect to a reference voltage signal, and a gate of the second compensation transistor is electrically connected to a gate of the first compensation transistor; and a third compensation transistor, wherein one of a source and a drain of the third compensation transistor is electrically connected to the second end of the storage capacitor, and the other of the source and the drain of the third compensation transistor is electrically connected to the light-emitting element and the second power supply line;

wherein the pixel circuit further comprises:

a first light emission control transistor, wherein one of a source and a drain of the first light emission control transistor is electrically connected to the other of the source and the drain of the driving transistor, and the other of the source and the drain of the first light emission control transistor is electrically connected to the first power supply line; and a second light emission control transistor, wherein one of a source and a drain of the second light emission control transistor is electrically connected to one of the source and drain of the driving transistor, and the other of the source and the drain of the second light emission control transistor is electrically connected to the light-emitting element;

wherein a gate of the first light emission control transistor is used to connect to a first light emission control signal, a gate of the second light-emission control transistor is used to connect to a second light emission control signal, a gate of the writing transistor is used to connect to a first control signal, the gate of the second compensation transistor and the gate of the first compensation transistor are used to connect to a second control signal, and a gate of the third compensation transistor is used to connect to a third control signal, and wherein working stages of the pixel circuit comprises:

an initialization phase; in the initialization phase, the driving transistor, the first light emission control transistor, the first compensation transistor, the second compensation transistor, and the writing transistor are in an on state, and the second light emission control transistor and the third compensation transistor are in an off state;

a threshold voltage detection and storage phase; in the threshold voltage detection and storage phase, the driving transistor, the first compensation transistor, the second compensation transistor, and the writing transistor are in an on state, and the first light emission control transistor, the second light emission control transistor, and the third compensation transistor are in an off state;

a second power signal (VSS) writing phase; in the VSS writing phase, the driving transistor, the writing transistor, and the third compensation transistor are in an on state, and the first compensation transistor, the second compensation transistor, and the first light emission control transistor and the second light emission control transistor are in an off state; and a light-emitting phase; in the light-emitting phase, the driving transistor, the first light emission control transistor, the second light emission control transistor, and the third compensation transistor are in an on state, and the writing transistor, the first compensation transistor, and the second compensation transistor are in an off state.

6. The display panel according to claim 5, wherein: in the initialization phase, the first control signal, the second control signal, and the first light emission control signal are set to a high potential; in the threshold voltage detection and storage phase, the first control signal and the second control signal is set to a high potential; in the VSS writing phase, the first control signal is set to a high potential, the second control signal changes from a high potential to a low potential, and the third control signal is set to a high potential; and in the light-emitting phase, the first light emission control signal, the second light emission control signal, and the third control signal are all set to a high potential.

* * * * *